(12) United States Patent
Yousif et al.

(10) Patent No.: US 8,329,593 B2
(45) Date of Patent: *Dec. 11, 2012

(54) METHOD AND APPARATUS FOR REMOVING POLYMER FROM THE WAFER BACKSIDE AND EDGE

(75) Inventors: Imad Yousif, San Jose, CA (US); Anchel Sheyner, San Francisco, CA (US); Ajit Balakrishna, Sunnyvale, CA (US); Nancy Fung, Sunnyvale, CA (US); Ying Rui, Santa Clara, CA (US); Martin Jeffrey Salinas, San Jose, CA (US); Walter R. Merry, Sunnyvale, CA (US); Shahid Rauf, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 787 days.

This patent is subject to a terminal disclaimer.

(21) Appl. No.: 12/001,989

(22) Filed: Dec. 12, 2007

(65) Prior Publication Data

US 2009/0156013 A1 Jun. 18, 2009

(51) Int. Cl.
*H01L 21/302* (2006.01)
*H01L 21/461* (2006.01)
*B44C 1/22* (2006.01)
*C03C 15/00* (2006.01)
*C03C 25/68* (2006.01)

(52) U.S. Cl. ............ 438/725; 216/58; 216/63; 438/706; 438/707

(58) Field of Classification Search .................... 216/63, 216/58; 438/725, 706, 707; 156/345.33, 156/345.35, 345.29, 345.48, 345.51
See application file for complete search history.

(56) References Cited

U.S. PATENT DOCUMENTS

| | | | | |
|---|---|---|---|---|
| 5,620,523 A | * | 4/1997 | Maeda et al. | 118/723 IR |
| 5,707,485 A | * | 1/1998 | Rolfson et al. | 438/716 |
| 6,059,985 A | * | 5/2000 | Yoshimura et al. | 216/37 |
| 6,814,811 B2 | * | 11/2004 | Ose | 118/715 |
| 7,967,996 B2 | * | 6/2011 | Collins et al. | 216/67 |
| 2003/0045131 A1 | * | 3/2003 | Verbeke et al. | 438/795 |
| 2004/0137745 A1 | * | 7/2004 | Houghton et al. | 438/706 |
| 2006/0102207 A1 | * | 5/2006 | Moriya | 134/34 |
| 2007/0224826 A1 | * | 9/2007 | Delgadino et al. | 438/706 |
| 2008/0179290 A1 | * | 7/2008 | Collins et al. | 216/67 |
| 2008/0179291 A1 | * | 7/2008 | Collins et al. | 216/67 |

FOREIGN PATENT DOCUMENTS

| | | | |
|---|---|---|---|
| JP | 10189515 A | * | 7/1998 |
| JP | 2000222344 A | | 8/2000 |
| JP | 2004235607 A | | 8/2004 |
| JP | 200660161 A | | 3/2006 |

* cited by examiner

*Primary Examiner* — Parviz Hassanzadeh
*Assistant Examiner* — Margaret D Klunk
(74) *Attorney, Agent, or Firm* — Robert M. Wallace

(57) ABSTRACT

Polymer is removed from the backside of a wafer held on a support pedestal in a reactor using an arcuate side gas injection nozzle extending through the reactor side wall with a curvature matched to the wafer edge and supplied with plasma by-products from a remote plasma source.

17 Claims, 9 Drawing Sheets

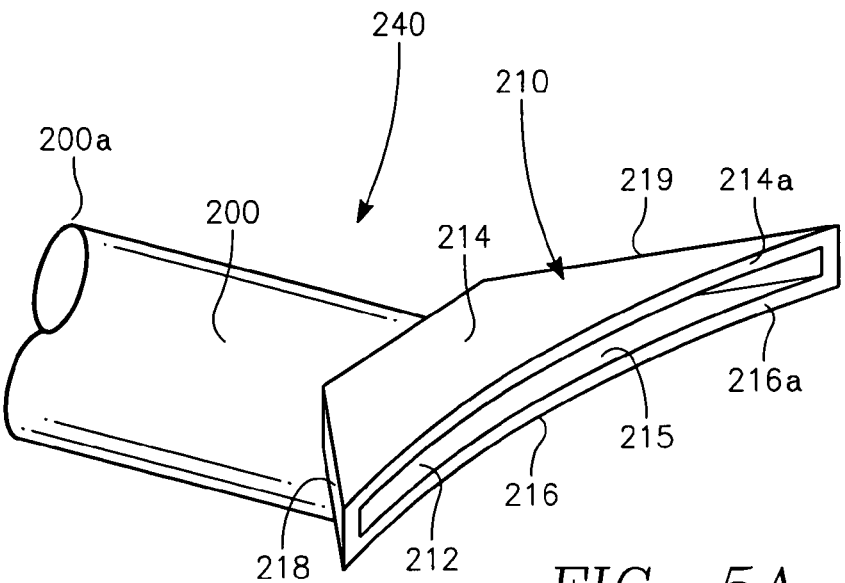
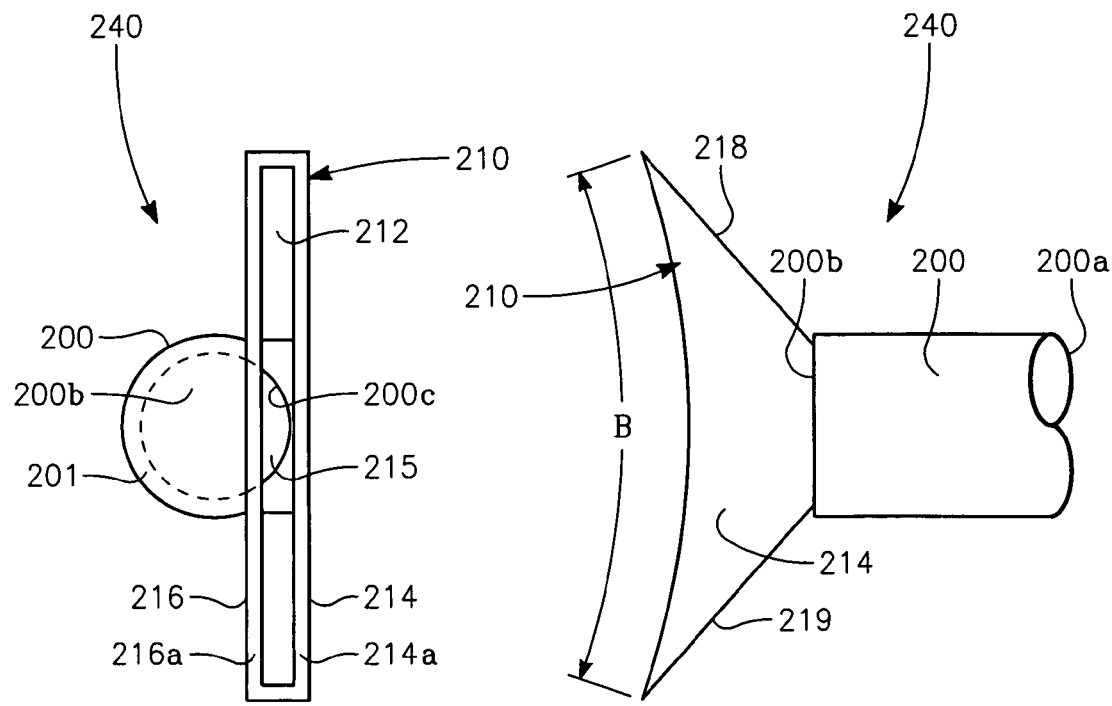
FIG. 5A
FIG. 5B
FIG. 5C

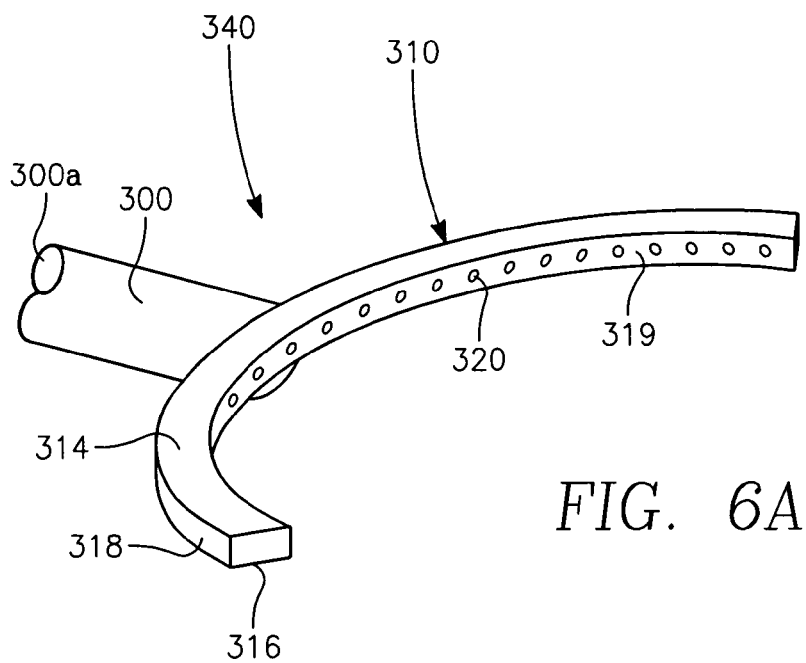
FIG. 6A
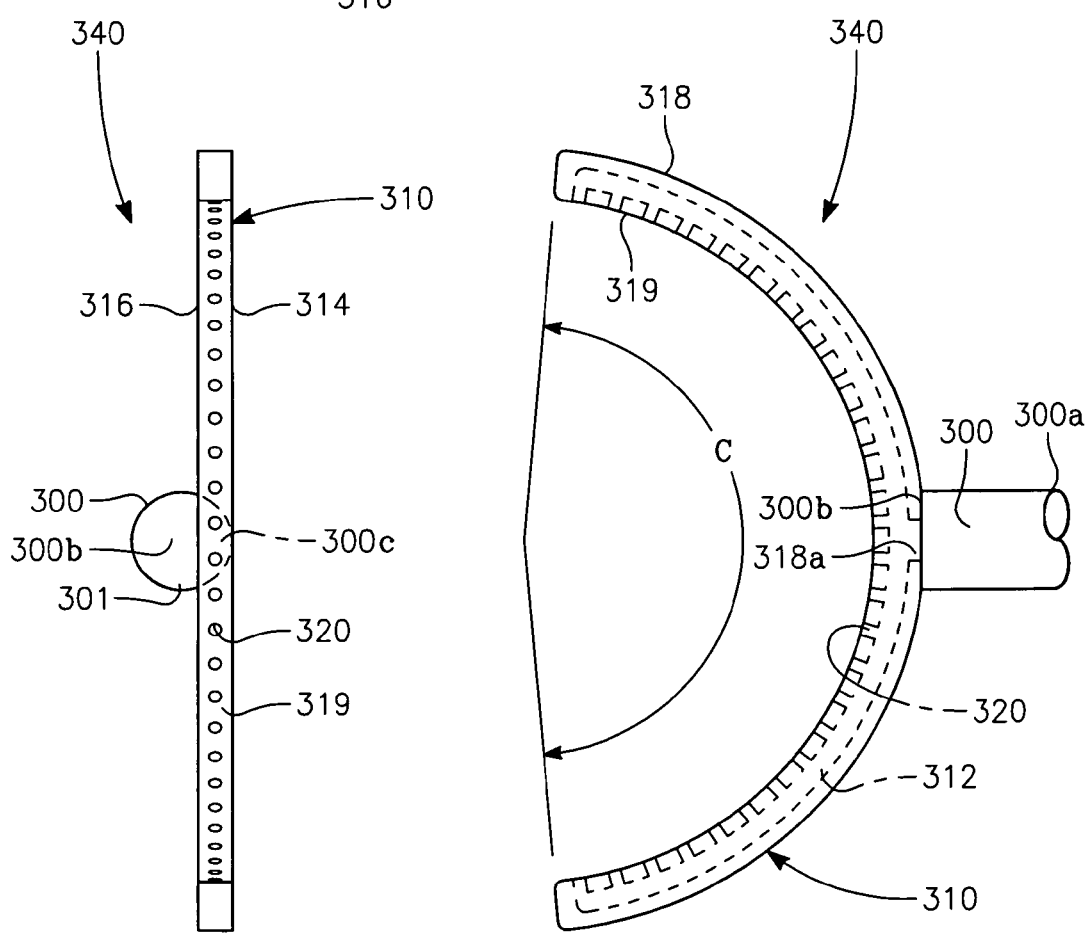
FIG. 6B
FIG. 6C

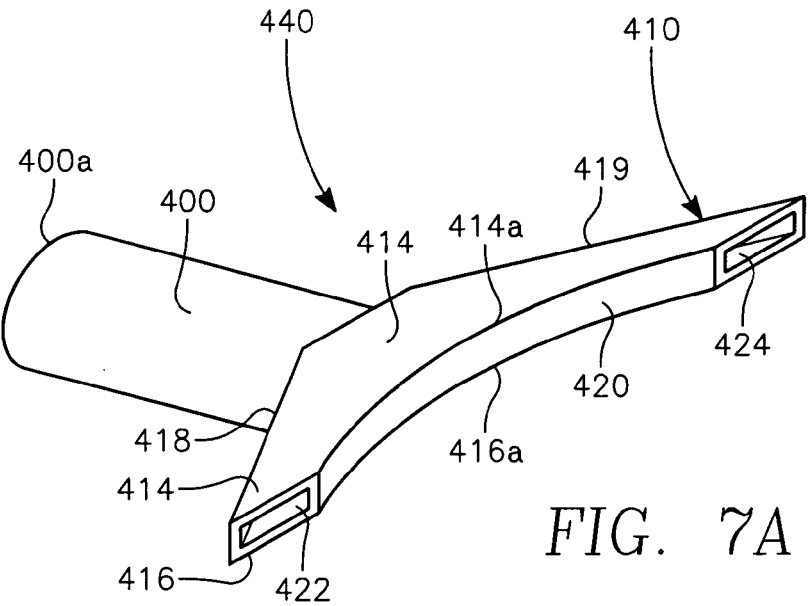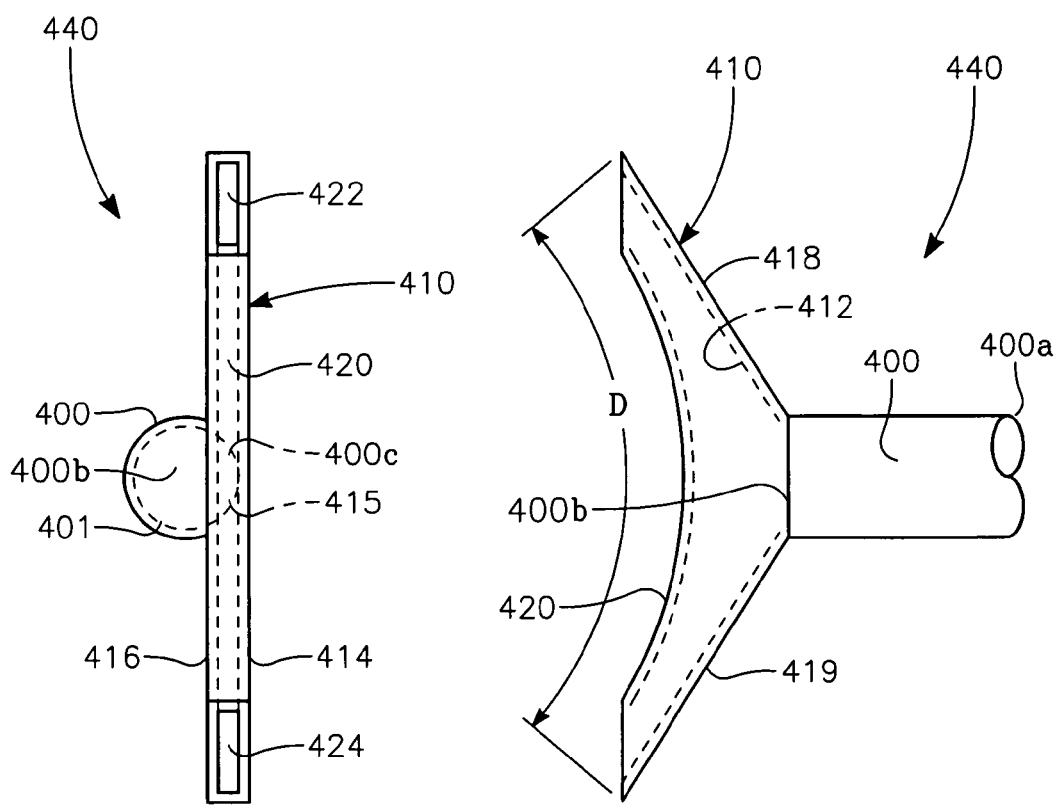
FIG. 7A
FIG. 7B
FIG. 7C

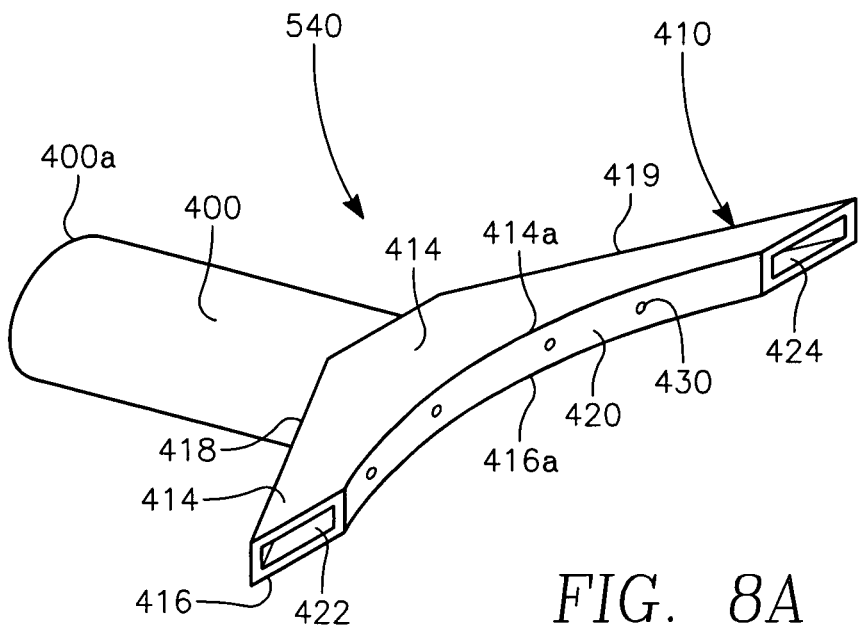
FIG. 8A
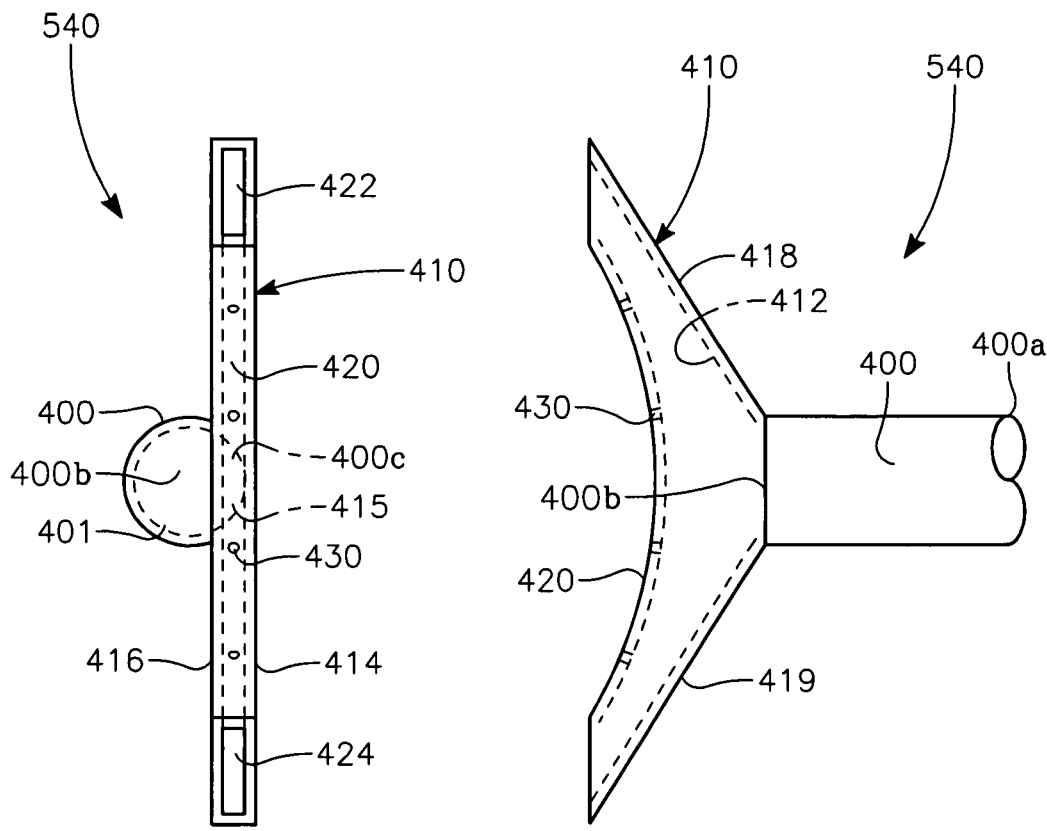
FIG. 8B
FIG. 8C

METHOD AND APPARATUS FOR REMOVING POLYMER FROM THE WAFER BACKSIDE AND EDGE

TECHNICAL FIELD

The disclosure concerns a method and apparatus for removing polymer from the backside and edge of a wafer following a plasma-enhanced etch process, without damaging delicate thin films on the wafer front side.

BACKGROUND

Plasma enhanced etch processes are employed for etching thin film structures on semiconductor wafers. One plasma enhanced etch process for etching a dielectric thin film, such as silicon dioxide, employs fluorocarbon and fluoro-hydrocarbon process gases. Such process gases dissociate into fluorine-rich etchant species and carbon-rich polymer species. The etchant species perform the desired etching while the polymer species provide desired passivation, as is well-known in the art. The polymer species tend to deposit on both the wafer front side as well as on the exposed edge portion of the wafer backside. Polymer deposition on the wafer backside may occur in some cases because the edge periphery of the wafer may be exposed during the etch process. Polymer deposited on the wafer front side is removed in the normal course of subsequent plasma process steps. However, the backside polymer film is not removed, at least in part because the wafer backside is shielded from plasma ion bombardment. Such backside polymer film builds up uncontrollably and can contribute to contamination during later plasma processing steps. We now propose to prevent such contamination by removing the backside polymer at the conclusion of the plasma etch process. The problem is how to accomplish this.

A special etch process could be performed to remove the backside polymer. The problem is that the wafer front side has certain delicate thin film materials, some of which may have been exposed during the prior dielectric etch step. The delicate thin film may be an ultra-low dielectric constant (ULK) material, for example. Such ULK materials tend to comprise a relatively high proportion of carbon (as does the backside polymer), and are therefore particularly susceptible to etching or damage when exposed to plasma chemistries capable of removing the backside polymer. It is very difficult or impossible to prevent damage to a ULK film on wafer front side while exposing the wafer to an environment capable of removing backside polymer.

SUMMARY

In one embodiment, polymer is removed from the backside of a wafer by placing the backside of the wafer on a support surface that leaves exposed a peripheral annulus of the backside of the wafer and providing an arcuate side gas injection nozzle extending into the chamber through a cylindrical side wall of the chamber, and having an arcuate gas injection zone distributed along an arc adjacent an edge of the wafer of a limited arc angle less than 180 degrees. In one embodiment, the support surface and wafer are raised toward the ceiling gas distribution plate past the arcuate side gas injection nozzle to confine the wafer front side in a small gap between the wafer front side and a ceiling of the chamber. Plasma by-products are generated in a remote plasma source from a process gas comprising an oxygen-containing species and the resulting the plasma by-products are introduced into the reactor chamber through the arcuate gas injection zone of the arcuate side gas injection nozzle to expose, to the plasma by-products, a section of the backside of the wafer subtended by the arc angle, to remove the polymer from the wafer backside while the wafer is continuously rotated. The plasma by-products are prevented from entering the gap between the wafer front side and the ceiling by introducing a purge gas through a gas distribution plate at the ceiling facing the wafer front side.

In one embodiment, photoresist may be removed from the front side of the wafer by lowering the support surface and wafer away from the ceiling gas distribution plate to a position below the arcuate side nozzle. The flow of the purge gas through the ceiling gas distribution plate is halted while plasma by-products from the remote plasma source are introduced through the arcuate side gas injection nozzle to expose, to the plasma by-products, a section of the front side of the wafer subtended by the arc angler front side, while continuously rotating the wafer.

BRIEF DESCRIPTION OF THE DRAWINGS

So that the manner in which the exemplary embodiments of the present invention are attained and can be understood in detail, a more particular description of the invention, briefly summarized above, may be had by reference to the embodiments thereof which are illustrated in the appended drawings. It is to be appreciated that certain well known processes are not discussed herein in order to not obscure the invention.

FIGS. 5A, 5B and 5C are, respectively, an orthographic projection, an elevational view and a plan view of a first embodiment of the arcuate side nozzle of the reactor of FIG. 1A.

FIGS. 6A, 6B and 6C are, respectively, an orthographic projection, an elevational view and a plan view of a second embodiment of the arcuate side nozzle of the reactor of FIG. 1A.

FIGS. 7A, 7B and 7C are, respectively, an orthographic projection, an elevational view and a plan view of a third embodiment of the arcuate side nozzle of the reactor of FIG. 1A.

FIGS. 8A, 8B and 8C are, respectively, an orthographic projection, an elevational view and a plan view of a fourth embodiment of the arcuate side nozzle of the reactor of FIG. 1A.

Figure 1A:
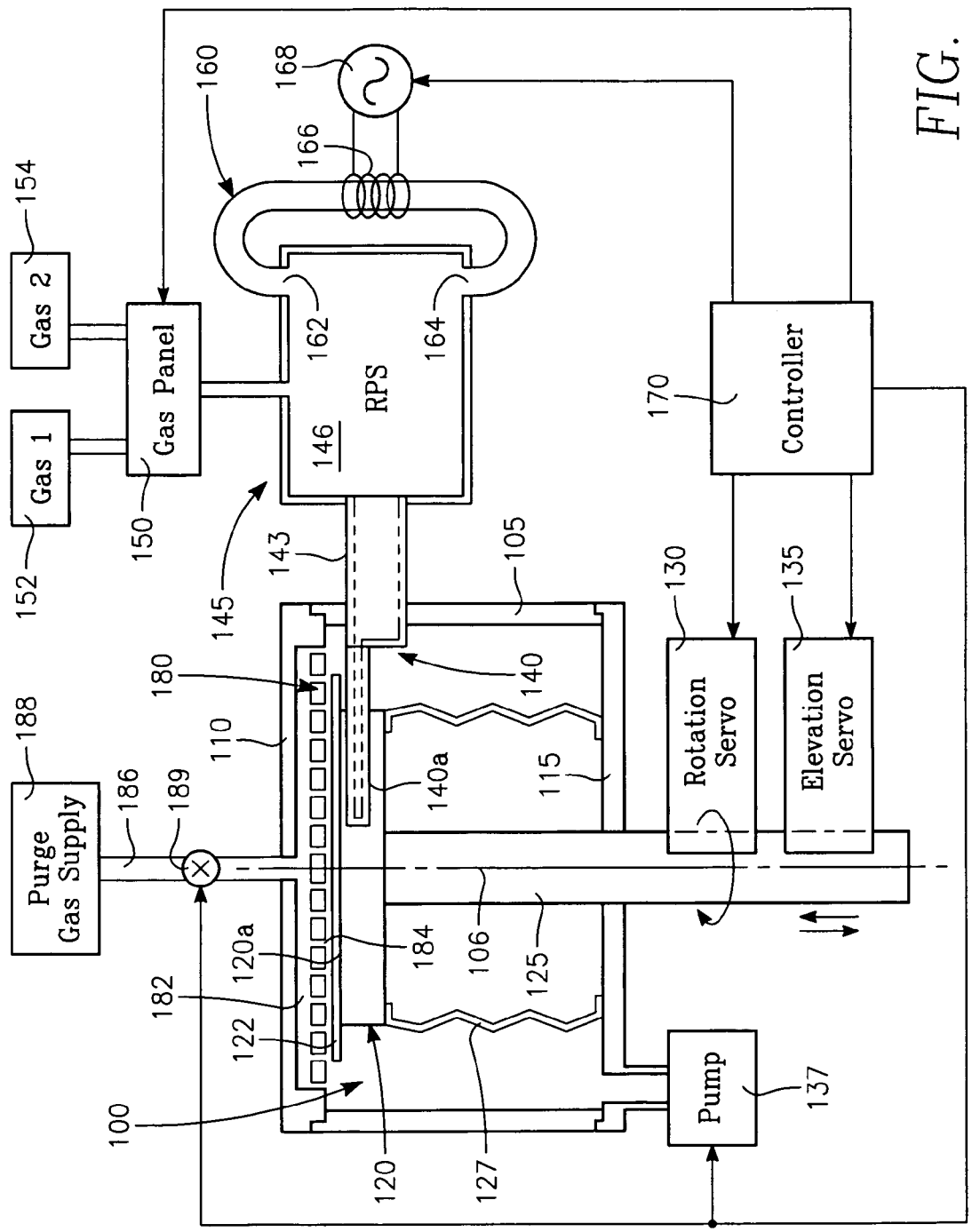
FIG. 1A is an elevational view of a reactor in accordance with one embodiment having a rotatable elevatable wafer support pedestal set to a raised position relative to an arcuate side nozzle, for removal of polymer from the wafer backside.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Figure 1B:
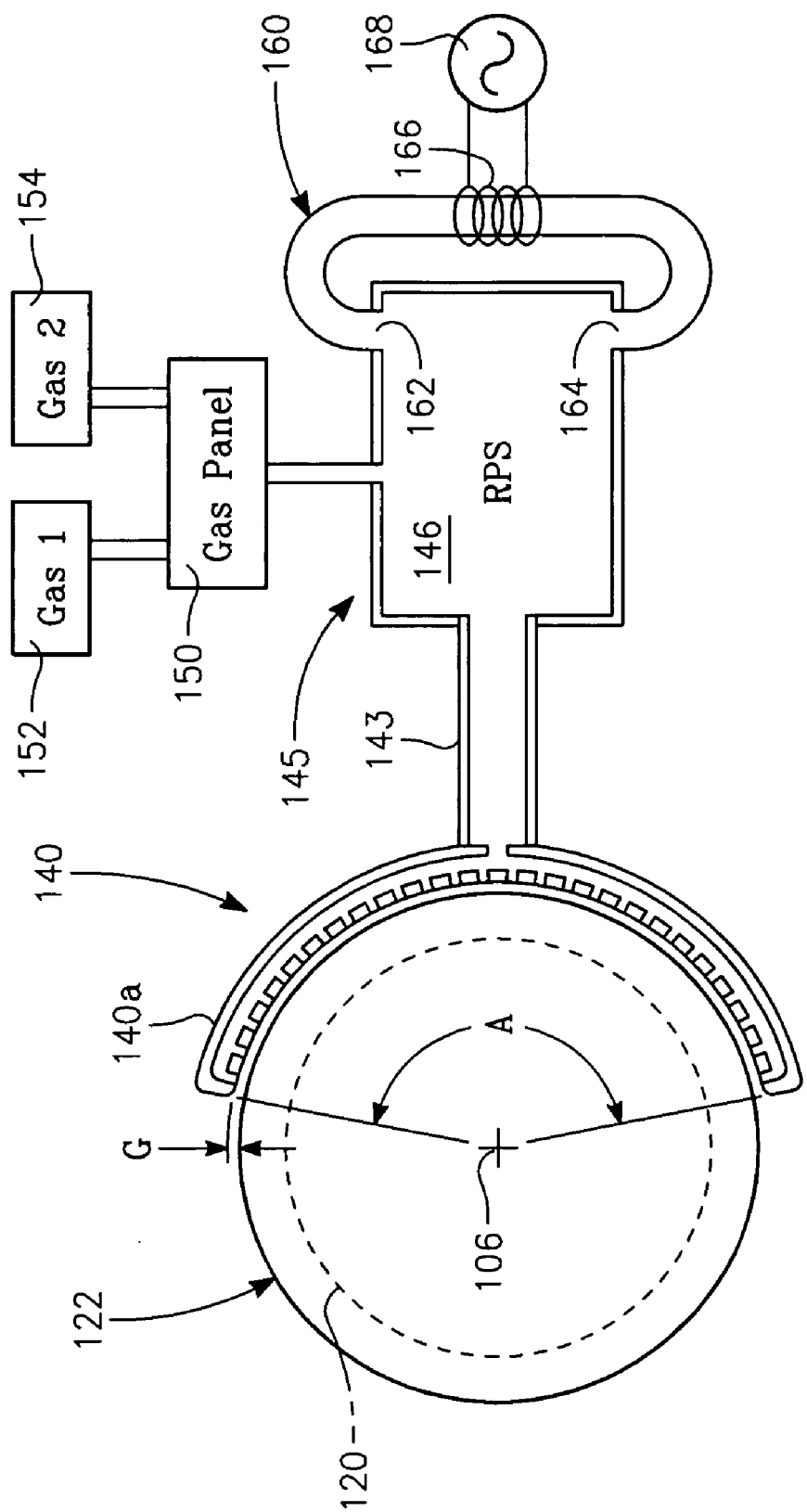
FIG. 1B is a plan view corresponding to FIG. 1A.
Figure 1C:
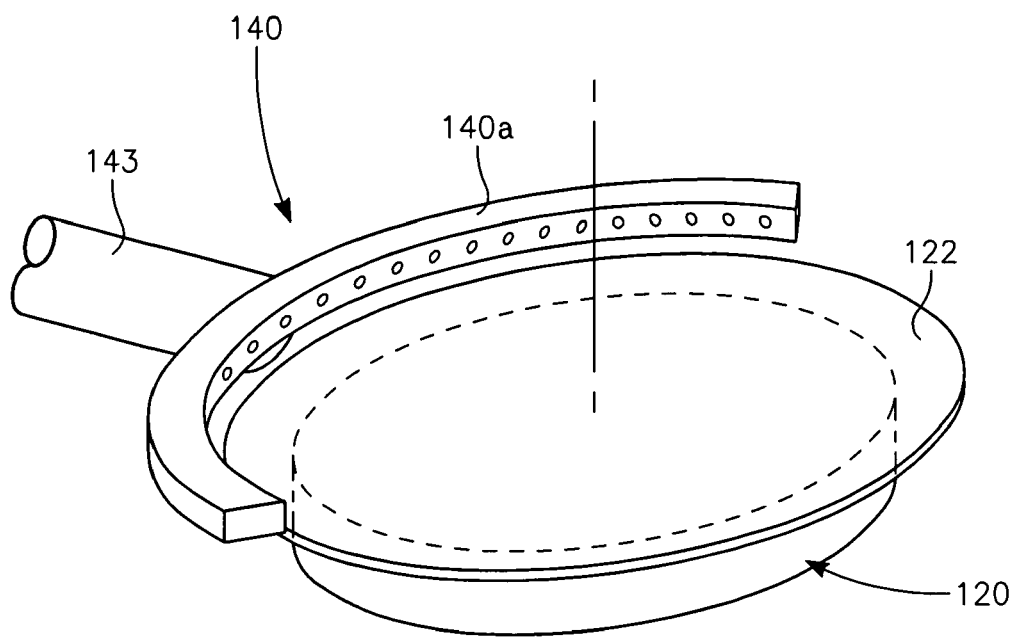
FIG. 1C is an orthographic projection corresponding to FIG. 1A.

Referring to FIGS. 1A, 1B and 1C, a reactor for removing polymer from the backside of a workpiece such as a semiconductor wafer is provided. The reactor includes a vacuum chamber 100 enclosed by a cylindrical side wall 105 defining an axis of symmetry 106, a ceiling 110 supported on the top of the side wall 105 and a floor 115 at the bottom of the side wall 105. A support pedestal 120 is provided within the interior of the chamber 100 and has a support surface 120a facing the ceiling 110 and generally perpendicular to the axis of symmetry 106. A planar workpiece such as a semiconductor wafer 122 may be placed on the support surface 120a. The diameter of the support surface 120a is less than that of the wafer 122 so that an edge periphery of the wafer backside is exposed. The exposed wafer backside edge periphery includes the peripheral region on the wafer backside on which polymer was deposited during a prior etch process step. The pedestal 120 is supported on a rotatable shaft 125 extending along the axis of symmetry 106 through the floor 115. The shaft 125 is rotatable about the axis of symmetry 106 and is translatable along the axis of symmetry 106 so that it may be elevated or depressed relative to the ceiling 110. A compressible-expandable lift bellows 127 surrounds the shaft 125 and is sealed to the floor 115 at its bottom and sealed to the bottom of the pedestal 120 at its top. A rotation servo 130 controls rotation of the shaft 125 and an elevation servo 135 controls translation of the shaft 125 along the axis of symmetry 106. A main chamber vacuum pump 137 coupled to the chamber 100 through the floor 115 controls the pressure within the chamber 100.

An arcuate side nozzle 140 extends through the side wall 105 in a radial direction relative to the axis of symmetry 106. A remote plasma source (RPS) 145 of a conventional type has an internal vacuum chamber 146 and maintains a plasma within its internal chamber 146 that is generated from process gases supplied through a gas distribution panel 150 from process gas supplies 152, 154. Neutrals and radicals dissociated in the plasma within the internal chamber 146 are drawn through the arcuate side nozzle 140 for injection into the main chamber 100. Although the RPS may employ any suitable technique of plasma generation, FIG. 1A depicts the RPS 145 as having a toroidal plasma source including an external reentrant conduit 160 having a pair of ends that enter the chamber 146 at ports 162, 164 on opposing sides of the chamber 146. RF source power is coupled into the interior of the reentrant conduit 160 by a coil 166 adjacent or around the conduit 160 and coupled to an RF source power generator 168. Conventional techniques other than the coil 166 may be employed for coupling RF power into the interior of the reentrant conduit 160. Typically, the main chamber vacuum pump 137 is operated to maintain a sufficient pressure difference between the chambers 100, 146 to draw plasma by-products out from the RPS chamber 146 and into the main chamber 100 through the arcuate side nozzle 140.

In order to provide plasma by-products (e.g., neutrals and radicals) capable of efficiently removing fluorocarbon polymers from the backside of the wafer, in one embodiment the gas supply 152 contains hydrogen gas while the gas supply 154 furnishes water vapor. In another embodiment, the gas supply 154 contains carbon dioxide or, alternatively, carbon monoxide.

In one embodiment, the ceiling 110 includes or supports a ceiling gas distribution plate 180. The ceiling gas distribution plate 180 includes an internal gas manifold 182 and plural gas injection orifices 184 in communication with the manifold 180 and opening into the chamber 100. A gas supply conduit 186 furnishes a purge gas to the manifold 182 from a purge gas supply 188 through a control valve 189. The purge gas may be a species that does not react with ULK or other materials on the wafer front side, and may be an inert gas such as Helium or Argon or a gas such as nitrogen that does not react with polymer. This feature creates a positive pressure in the region between the wafer front side and the ceiling 110, so that process gas or plasma by-products introduced through the arcuate side nozzle are prevented from reaching the wafer front side. This can protect susceptible thin films on the wafer front side during back side polymer removal. A controller 170 governs outlet valve 189, the vacuum pump 137, the rotation servo 130, the elevation servo 135, the RF generator 168 and the gas panel 150.

Figure 2:
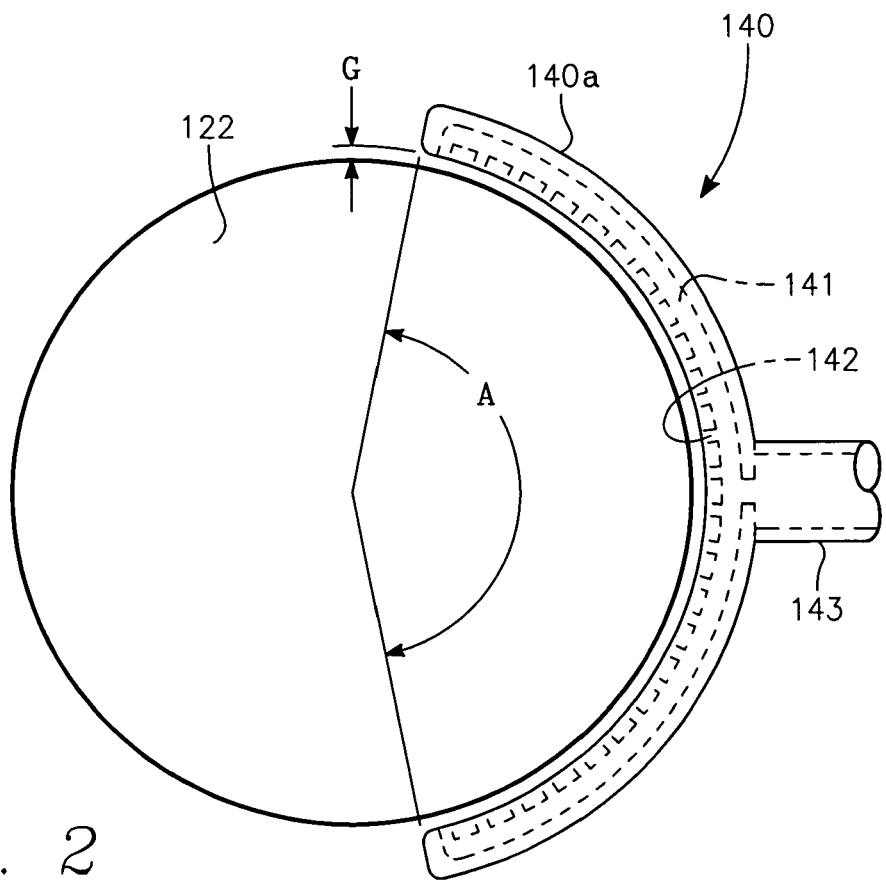
FIG. 2 is a diagram comparing coverage of the wafer with process gases at different arc lengths of a distribution nozzle.

The top view of FIG. 2 shows in hidden line the internal features of the arcuate side nozzle 140, including a nozzle head 140a enclosing an arcuate gas flow channel 141 and plural spaced gas injection nozzle orifices 142 facing radially inwardly toward the wafer 122. A cylindrical conduit 143 of the nozzle 140 is coupled between the RPS chamber 146 and the arcuate gas flow channel 141. As shown in FIGS. 1A and 1B, the conduit 143 of the arcuate side nozzle 140 extends through the chamber side wall 105, while the nozzle head 140a is completely enclosed by the side wall 105. In other embodiments, the conduit 143 may lie completely outside the chamber 100 while the nozzle head 140a extends through the side wall 105.

In one of several embodiments to be described below, the nozzle 140 extends over an arc length corresponding roughly to a half circle or less. Because there is a small (e.g., 1-5 mm) gap G (FIG. 2) between the nozzle 140 and the edge of the wafer 122, the nozzle orifices 142 spray gas or plasma by-products over a segment of the edge of the pie-shaped area of the wafer 122 (or of the wafer back side). The pie-shaped area corresponds to an arc length of about 170 degrees (angle "A") in FIG. 2, for example, but may be a lesser arc length in other embodiments. Uniform removal of polymer from the entire peripheral annulus of the wafer backside is accomplished by rotating the wafer support pedestal 120. For each rotation of the wafer, the exposure time for each area on the wafer backside is the reciprocal of the rotation rate (RPM) multiplied by the ratio of the angle A subtended by the nozzle 140 (FIG. 1B) to 360 degrees:

$$\text{exposure time} = [1/\text{RPM}][A/360]$$

In one embodiment, the etch rate (productivity) of the back side polymer removal etch process is increased by increasing the angle A subtended by the side nozzle 140. While confining the nozzle opening to a very narrow angle (e.g., 5 degrees) ensures a concentrated and effect stream of polymer etch plasma by-products, it depresses productivity of the process. We have discovered that the loss or diffusion of plasma by-products that accompanies an increase in the angle A is less than the increase in exposure time, so that increasing the angle A increases productivity, up to a point. Above a large arc distance, e.g. at approximately A=180 degrees, further increases in A cause a greater loss or diffusion of plasma by-products. Such a loss can, in some embodiments, depress the etch rate and offset further gain in productivity from the increased exposure time. The embodiments of the arcuate side nozzle 140 disclosed herein fall within an optimum trade-off between exposure time and plasma by-product loss, in accordance with our discovery, wherein the angle A is generally less than 180 degrees but generally greater than about 20 degrees.

Figure 3:
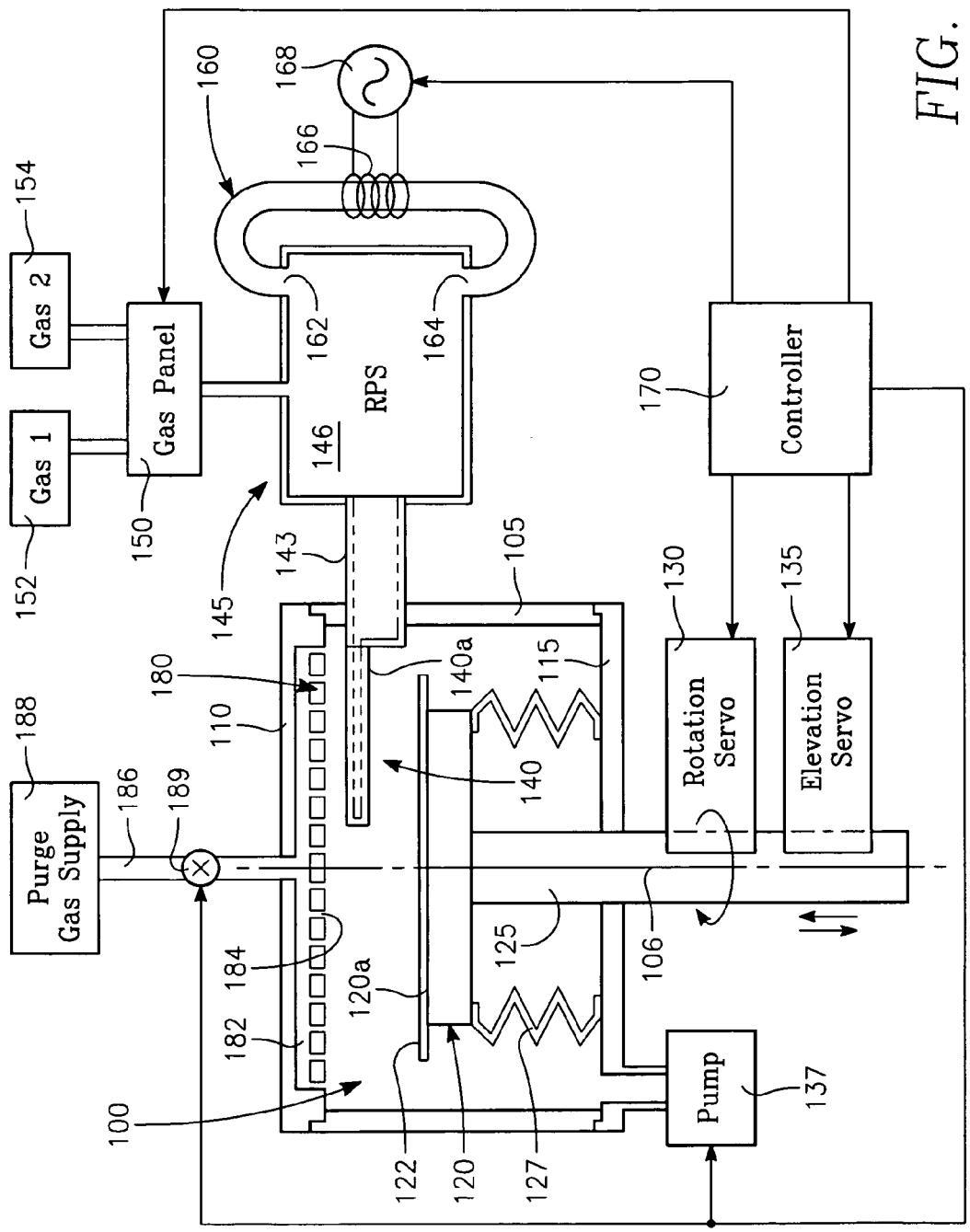
FIG. 3 is an elevational view of the reactor of FIG. 1A with the wafer support pedestal in a depressed position for removing photoresist from the wafer front side.

The reactor of FIG. 1A is depicted as having the pedestal 120 raised to or slightly above the level of the arcuate side nozzle 140 so that the plasma by-products or etchant species from the nozzle 140 flow to the wafer backside. However, the reactor may be employed to remove photoresist from the wafer front side. For this purpose, the pedestal 120 may be depressed to bring the wafer 122 below the level of the arcuate side nozzle 140 (as depicted in FIG. 3) so that gases from the nozzle 140 flow to the wafer front side. In this embodiment, the purge gas flow from the ceiling gas distribution plate may be halted. For this application, embodiments of the arcuate side nozzle 140 having a greater arc angle A are more efficient for covering the entire wafer surface during a single wafer rotation. This is because the backside polymer removal process requires plasma by-product distribution to only an edge peripheral annulus of the wafer backside, while photoresist removal requires distribution of the plasma by-products to the entire surface of the wafer front side.

Figure 4:
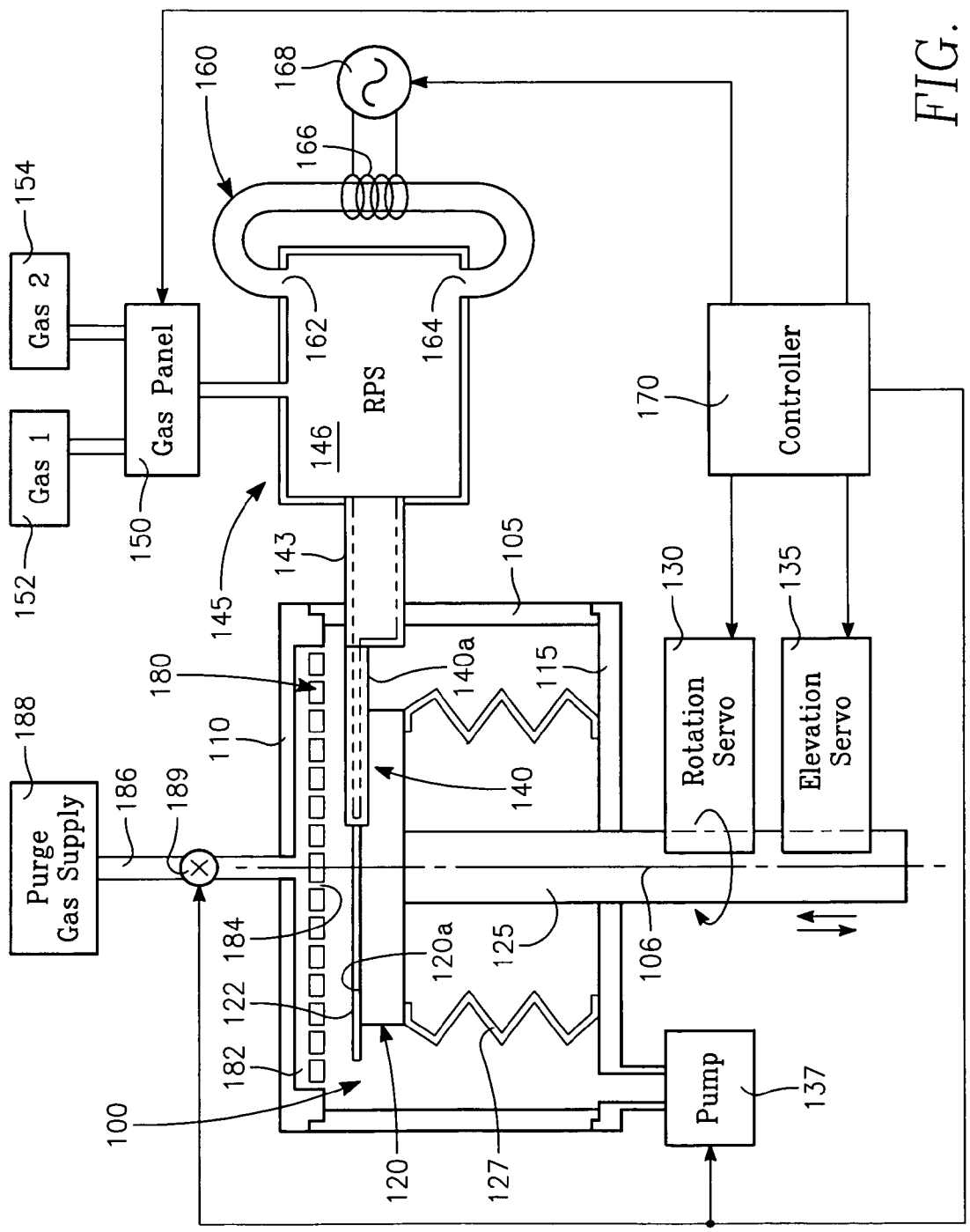
FIG. 4 is an elevational view of the reactor of FIG. 1A with the wafer support pedestal in an intermediate position.

FIG. 4 depicts the reactor with the wafer pedestal 120 raised to an intermediate position between the raised position of FIG. 1A and the depressed position of FIG. 3. In this intermediate position, the arcuate side nozzle 140 faces the edge of the wafer 122. This mode may be useful for removing polymer from both the wafer backside and from the beveled region of the wafer edge.

FIGS. 5A-5C depict one embodiment of an arcuate side nozzle 240 which is a modification of the arcuate side nozzle 140 of FIG. 1B. The arcuate side nozzle 240 of FIGS. 5A-5C has a limited arc angle B of about 30 degrees. Its main use is for backside polymer removal. The nozzle 240 of FIGS. 5A-5C has a round hollow cylindrical gas supply conduit 200 having a supply end 200a and an output end 200b. A fan-shaped nozzle head 210 is coupled to the conduit output end 200b. The fan-shaped nozzle head 210 has a hollow interior 212 enclosed by a fan-shaped ceiling 214, a fan-shaped floor 216 facing the ceiling 214, a first angled flat side wall 218 and a second angled flat side wall 219. In one implementation, the fan shaped ceiling 214 and side wall 216 have respective arcuate edges 214a, 216a facing the workpiece or wafer 122 shown in FIG. 1A. The arcuate edges 214a, 216a each have a radius of curvature corresponding roughly to the radius of the workpiece or wafer 122. The radius of curvature of the arcuate edges 214a, 216a may be slightly larger than the radius of the wafer, the difference corresponding to a gap G (see FIG. 2) between the peripheral edge of the wafer 122 and the nozzle arcuate edges 214a, 216a. The angled side walls 218, 219 converge toward one another at the conduit output end 200b, and terminate at the conduit output end 200b to define an opening 215 (FIG. 5B) of the nozzle head 210 facing the conduit output end 200b. The opening 215 coincides with a portion 200c of the conduit output end 200b that is circumscribed by the nozzle head opening 215. The remaining portion of the conduit output end 200b is blocked by an end cap 201. The arc angle subtended by the arcuate edges 214a, 216a of the nozzle head 210 is less than 45 degrees. In the illustrated embodiment, it is approximately 30 degrees. The nozzle 240 of FIGS. 5A-5C is formed of quartz or similar material using conventional manufacturing techniques.

FIGS. 6A-6C depict one embodiment of an arcuate side nozzle 340 which is a modification of the arcuate side nozzle 140 of FIG. 1B. The nozzle 340 of FIGS. 6A-6C has a large arc angle C of about 180 degrees. It is useful for both backside polymer removal and for front side photoresist removal. The nozzle 340 of FIGS. 6A-6C has a round hollow cylindrical gas supply conduit 300 having a supply end 300a and an output end 300b. An annular nozzle head 310 is coupled to the conduit output end 300b. The annular nozzle head 310 has a hollow interior 312 (shown in hidden line in FIG. 6C) enclosed by an annular ceiling 314, an annular floor 316 facing the ceiling 314, an annular outer side wall 318 and an annular inner side wall 319. The annular inner side wall 319 has a radius of curvature corresponding roughly to the radius of the workpiece or wafer 122. The radius of curvature of inner side wall 319 may be slightly larger than the radius of the wafer, the difference corresponding to a gap G (see FIG. 2) between the peripheral edge of the wafer 122 and the nozzle inner side wall 319. Plural gas injection orifices 320 extend through the inner annular side wall 319 and communicate with the hollow interior 312 of the nozzle head 310. The outer side wall 318 has an opening 318a to the nozzle hollow interior 312 that communicates with and covers a portion 300c of the conduit output end 300b. The remaining portion of the conduit output end 300b is blocked by an end cap 301. The arc angle subtended by the inner side wall 319 of the nozzle head 310 greater than 90 degrees. In the illustrated embodiment, it is approximately 180 degrees. The nozzle of FIGS. 6A-6C is formed of quartz or similar material using conventional manufacturing techniques.

FIGS. 7A-7C depict an embodiment of an arcuate side nozzle 440 which is a modification of the arcuate side nozzle 140 of FIG. 1B. The arcuate side nozzle 440 of FIGS. 7A-7C has an arc angle D of about 30-60 degrees. The nozzle 440 of FIGS. 7A-7C has a round hollow cylindrical gas supply conduit 400 having a supply end 400a and an output end 400b. A fan-shaped nozzle head 410 is coupled to the conduit output end 400b. The fan-shaped nozzle head 410 has a hollow interior 412 enclosed by a fan-shaped ceiling 414, a fan-shaped floor 416 facing the ceiling 414, a first angled flat rear side wall 418 and a second angled flat rear side wall 419. In addition, an arcuate front side wall 420 defines a pair of outlet ports 422, 424 at either side of the nozzle head 410. The arcuate front side wall 420 and the pair of gas outlet ports 422, 424 face the workpiece or wafer 122 shown in FIG. 1A. In one implementation, the fan shaped ceiling 414 and side wall 416 have respective arcuate edges 414a, 416a matching the arc of the arcuate front side wall 420 and face the workpiece or wafer 122 shown in FIG. 1A. The arcuate edges 414a, 416a and the arcuate front side wall 420 each have a radius of curvature corresponding roughly to the radius of the workpiece or wafer 122. The radius of curvature of the arcuate edges 414a, 416a and side wall 420 may be slightly larger than the radius of the wafer, the difference corresponding to a gap G (see FIG. 2) between the peripheral edge of the wafer 122 and the nozzle arcuate edges 414a, 416a. The angled side walls 418, 419 converge toward one another at the conduit output end 400b, and terminate at the conduit output end 400b to define an opening 415 (shown in hidden line in FIG. 7B) of the nozzle head 410 facing the conduit output end 400b. The opening 415 spans a portion 400c of the conduit output end 400b that is circumscribed by the nozzle head opening 415. The remaining portion of the conduit output end 400b is blocked by an end cap 401. The arc angle subtended between the pair of outlet ports 422, 424 of the nozzle head 410 is in a range of approximately 30-60. In the illustrated embodiment, it is approximately 30 degrees. The nozzle 440 of FIGS. 7A-7C is formed of quartz or similar material using conventional manufacturing techniques. The embodiment of FIGS. 7A-7C may have an advantage of providing a tangential flow of plasma by-product relative to the edge of the wafer as distinguished from a flow directly at the wafer. During removal of polymer from the wafer backside, this feature can reduce the tendency of the injected plasma by-products or gases to force their way into the narrow zone of the wafer-to-ceiling gap. In each of the embodiments described herein, the wafer-to-ceiling gap may be in a range of about 1-10 mm, for example. This can, in some embodiments, reduce the risk of damage to susceptible thin films on the wafer front side.

FIGS. 8A-8C depict a fourth embodiment that is a modification of the embodiment of FIGS. 7A-7C, in which the front arcuate side wall 420 is provided with plural gas injection orifices 430 through the wall 420. This embodiment can combine the aspects of tangential flow of plasma by-products toward the wafer edge, as described with reference to the embodiment of FIGS. 7A-7C, and direct flow toward the wafer edge, as in the embodiment of FIGS. 6A-6C.

While the foregoing is directed to embodiments of the present invention, other and further embodiments of the invention may be devised without departing from the basic scope thereof, and the scope thereof is determined by the claims that follow.

What is claimed is:

1. A method of processing in a reactor chamber a wafer having a polymer layer on a backside of the wafer, comprising:
    placing the backside of the wafer on a support surface provided in the chamber that leaves exposed a peripheral annulus of the backside of the wafer while covering the remaining portion of said backside of the wafer with said support surface;
    providing a cylindrical side wall and an arcuate side gas injection nozzle extending into the chamber through said cylindrical side wall, and having an arcuate gas injection zone distributed along an arc adjacent an edge of the wafer;
    raising the support surface and wafer toward a ceiling gas distribution plate of the chamber and past said arcuate side gas injection nozzle to confine the wafer front side in a gap between said wafer front side and a ceiling of the chamber;
    generating plasma by-products in a remote plasma source from a process gas comprising an oxygen-containing species and introducing the plasma by-products into the reactor chamber through the arcuate gas injection zone of the arcuate side gas injection nozzle to expose, to the plasma by-products, a section of the backside of the wafer subtended by said arc, to remove the polymer from the wafer backside; and
    blocking the plasma by-products from entering the gap between the wafer front side and the ceiling by introducing a purge gas through a gas distribution plate at the ceiling facing the wafer front side;
    wherein the wafer front side has photoresist deposited thereon, the method further comprising:
    lowering the support surface and wafer away from the ceiling gas distribution plate to a position below the arcuate side nozzle;
    halting flow of the purge gas through the ceiling gas distribution plate;
    introducing the plasma by-products into the reactor chamber through the arcuate side gas injection nozzle to expose, to the plasma by-products, a section of the front side of the wafer subtended by said arc angle, to remove the photoresist from the wafer front side; and continuously rotating the wafer.

2. The method of claim 1 wherein said arc subtends an angle of greater than 20 degrees and less then 180 degrees.

3. The method of claim 2 further comprising maintaining a gap not exceeding 1-5 mm between said arcuate gas injection zone and a corresponding portion of the edge of the wafer.

4. The method of claim 1 further comprising maintaining a separation gap between said arc of said arcuate gas injection zone and said edge of said wafer between about 1 mm and 5 mm.

5. The method of claim 1 wherein said purge gas comprises any one of an inert gas or nitrogen.

6. The method of claim 5 wherein said process gases of the remote plasma source comprise hydrogen gas and water vapor.

7. The method of claim 5 wherein said process gases comprise carbon dioxide and hydrogen gas.

8. The method of claim 1 wherein said process gases comprise oxygen-containing species.

9. The method of claim 8 wherein said process gases further comprise hydrogen gas.

10. The method of claim 1 further comprising evacuating said reactor chamber with a first vacuum pump and maintaining said reactor chamber at a pressure below that of the remote plasma source.

11. The method of claim 1 further comprising maintaining said gap between said wafer front side and the ceiling at less than 1-10 μm.

12. The method of claim 1 wherein said arcuate gas injection one has a radius of curvature corresponding to a radius of curvature or the edge of the wafer.

13. The method of claim 1 wherein:
    providing an arcuate side gas injection nozzle comprises providing an arcuate wall along said arcuate gas injection zone and providing plural gas injection orifices through said arcuate wall; and
    introducing the plasma by-products into the reactor chamber through the arcuate gas injection zone comprises flowing said plasma by-products through said plural gas injection orifices.

14. The method of claim 13 wherein said arc angle of said arcuate gas injection zone is about 30 degrees.

15. The method of claim 13 wherein said arc angle of said arcuate gas injection nozzle is about 170 degrees.

16. The method of claim 1 wherein:
    providing an arcuate side gas injection nozzle comprises providing an arcuate wall along said arcuate gas injection zone and providing a pair of ports through said arcuate wall at opposite ends of said arcuate side gas injection nozzle facing the edge of said wafer tangentially; and
    introducing the plasma by-products into the reactor chamber through said arcuate gas injection zone comprises flowing said plasma by-products through said pair of ports tangentially toward the edge of said wafer.

17. The method of claim 16 further comprising providing plural as injection orifices through said arcuate wall, wherein the plasma by-products flow through said pair of ports and through said plural gas injection orifices.

* * * * *